United States Patent
Holland

(10) Patent No.: US 6,225,549 B1
(45) Date of Patent: May 1, 2001

(54) THERMOELECTRIC DEVICE-TWO FOR PRODUCING AN ELECTRIC CURRENT

(76) Inventor: Beecher J. Holland, 600 Morison Ave., Kingsport, TN (US) 37660

( * ) Notice: Subject to any disclaimer, the term of this patent is extended or adjusted under 35 U.S.C. 154(b) by 0 days.

(21) Appl. No.: 09/450,667

(22) Filed: Nov. 30, 1999

Related U.S. Application Data

(63) Continuation-in-part of application No. 09/425,944, filed on Oct. 25, 1999, now abandoned.

(51) Int. Cl.[7] ...................................................... H01L 35/30
(52) U.S. Cl. ............................................ 136/205; 310/306
(58) Field of Search .................................. 136/202, 205; 310/306

(56) References Cited

U.S. PATENT DOCUMENTS 3,358,162 * 12/1967 Krake et al. ........................ 310/4
4,019,113 * 4/1977 Hartman ............................ 321/1.5

OTHER PUBLICATIONS

Updated Perspective on the Potential for Thermionic Conversion to Meet 21st Century Energy Needs, Fitzpatrick, G.O.; Britt, E.J.; Moyzhes, B., Energy Conversion Engineering Conference, 1997, IECEC–97, Proceedings of the 32nd InterSociety, 1997, pp. 1045–1051, vol. 2, No month given.*

* cited by examiner

Primary Examiner—Kathryn Gorgos
Assistant Examiner—Thomas H Parsons

(57) ABSTRACT

The present invention is a thermoelectric cell employing, in several embodiments, single and multiple anode electron emitters, single and multiple anodes, single and multiple within-cell resistors, and single and multiple cathodes.

6 Claims, 2 Drawing Sheets

THERMOELECTRIC DEVICE-TWO FOR PRODUCING AN ELECTRIC CURRENT

CROSS-REFERENCE TO RELATED APPLICATIONS

This application is a continuation-in-part of application Ser. No. 09/425,944, filed Oct. 25, 1999 now abandoned.

BACKGROUND OF THE INVENTION

1. Field of the Invention

The present invention pertains to a thermoelectric cell for producing an electric current.

2. Description of the Related Art

A single U.S. patent application Ser. No. 09/196,597 filed Nov. 20, 1998 (now abandoned) by the present author, is to the knowledge of the present author, the most nearly related device. FIG. 1 of "597" can be construed as a slightly different form of FIG. 2 of "597".

The present invention differs from "597" in that the present invention employs multiple anode means in electrical parallel in one cell, multiple anode electron emitter means with one electron collector means, multiple within-cell resistor means in one cell and multiple cathode means in electrical parallel in one cell in several different combinations. Additionally, the present invention provides for a cell wherein the anode section of the cell is physically separate from the within-cell resistor and the cathode section of the cell, a characteristic not noted as a possibility by "597" though it may be deemed apparent. Definitely not noted in "597" is the present description of a cell having multiple anode means in electrical parallel and in electrical contact with one anode electron emitter means common to all anode means.

SUMMARY OF THE INVENTION

Frequently, with cells of the present invention, as well as "597", an unusual characteristic is that over a range of resistance of a circuit external to a cell, current increases as well as voltage. Such is possibly the result of back voltage on the anode resulting in "compression" of electrons and increased density of electrons on the anode of the cell.

Another unusual characteristic, to the author's knowledge, of the present invention is that in those embodiments having multiple anode means with each anode means having its own anode electron emitter means, wherein the anode means, connecting to common cathode means and an anode lead in common, are in each case electrically in parallel and appear to give at least partly additive outputs.

The "597" application shows a cell anode section of single anode electron emitter means and single anode means.

A number of different thermoelectric cells can be made based on four different embodiments in design.

First design:

A thermoelectric cell is comprised of a single anode means in electrical contact with multiple anode electron emitter means, displaying thermally induced electron emission, and of single within-cell electrical resistor means connected by electrical conductor means to said single anode means. Said cell further comprises a single cathode means connected by electrical conductor means to said single resistor means. The Area of contact between a cathode portion of said cathode means and a cathode electron emitter means, displaying thermally induced electron emission, is smaller than the area of contact between said single anode means and said multiple anode electron emitter means.

Tests of cells as described as "first design" have been conducted, (Jul. 14, 1999) and (Jul. 26, 1999). One such cell tested is described by FIG. 1 herein. Multiple anode emitters in the design of FIG. 1 increase output. Some slight overlap of anode emitters in the FIG. 1 tests may have made the cell somewhat like FIG. 3 of "597" but for a thin-sheet anode there is probably no discernible difference. The cell of FIG. 1 herein was tested with both powdered graphite emitters and with granular non-iodized salt emitters. Anode means and cathode means and within-cell resistor means for cells of "first design" type if accomplished by printing means may be very economical. Other tests of a more complex single-anode-means, multiple-anode-emitter-means cell with no overlap of anode emitter means have been conducted (Jun. 26, 1999, 7:56 AM and 8:24 AM).

Second design:

A thermoelectric cell is comprised of multiple anode means, connected to one another in electrical parallel, each anode means in electrical contact with a separate anode electron emitter means, displaying thermally induced electron emission, and of single within-cell electrical resistor means connected by electrical conductor means to said multiple anode means and of single cathode means connected by electrical conductor means to said single resistor means wherein the area of contact between a cathode portion of said single cathode means and a cathode electron emitter means, displaying thermally induced electron emission, is less than the area of contact between said multiple anode means and respective anode electron emitter means.

A cell of "second design" type has been tested wherein anode means were aluminum sheet and anode means widths were convoluted and anode emitters were powdered graphite (Jun. 27, 1999, 12:37 AM). Use of multiple anode means in a single cell allows large anode means surface area in a single cell without impractical anode means lengths. Separate entities as electrical resistor means, cathode means and anode means/anode emitter means simplify assembly of cells.

Third design:

A thermoelectric cell is comprised of multiple anode means, connected to one another in electrical parallel, in electrical contact with separate anode electron emitter means, displaying thermally induced electron emission, and of multiple within-cell electrical resistor means as appropriate, appropriate being determined by wattage service rating of said resistor means and total wattage of anode means to which each said resistor means connects to, and of single cathode means connected by electrical conductor to said multiple resistor means wherein the area of contact between a cathode portion of said single cathode means and a cathode electron emitter means, displaying thermally induced electron emission, is smaller than the area of contact between said multiple anode means and said separate anode electron emitter means.

A thermoelectric cell as "third design" above is like "second design" wherein said cell further comprises additional electrical within-cell electrical resistor means yielding multiple resistor means as appropriate, appropriate being as previously described, and wherein said single cathode means connects by electrical conductor to said multiple resistor means.

A cell of "third design" type is shown by FIG. 3 herein.

Fourth design:

A thermoelectric cell design like "first design," or like "second design," or like "third design," wherein a thermoelectric cell further comprises additional cathode means to yield multiple cathode means, connected to one another in electrical parallel, connected by electrical conductor to each said within-cell resistor means in said cell wherein the total area of contact, in said multiple cathode means, of said cathode portions of said multiple cathode means with respective cathode electron emitter means is smaller than total area of contact of all anode means in said cell with all anode electron emitter means in said cell.

An example of a "fourth design" cell, as evolved from "third design" FIG. 3, is shown by FIG. 4. Cathode means connected in electrical parallel are no different from anode means in electrical parallel, other than size. A more complex and expensive cell as "fourth design," FIG. 4 herein component array has been tested (Sep. 18, 1999, 9:27 AM, 11:05 AM and 9:20 PM).

An additional "fourth design" cell, as evolved from "second design FIG. 2" component array used anode electron emitter means 2A and 2B of FIG. 2 to form a single continuous anode electron emitter means common to all said multiple anode means. Such a cell has been tested (Nov. 15, 1999, 11:15 A.M.). Later testing (Nov. 17, 1999 and Nov. 18, 1999) of such a cell using shorter and more narrow anode means than those of Nov. 15, 1999 indicated greater amperage and voltage output per unit area of anode surface than with the larger anodes of Nov. 15, 1999, probably because the shorter anodes resulted in even more efficient return of electrons to the emitter. Anodes of Nov. 15, 1999, Nov. 17, 1999 and Nov. 18, 1999 tests were flat strips rather than convoluted as shown in FIG. 2 herein. Cells similar to those of Nov. 15, 1999, Nov. 17, 1999 and Nov. 18, 1999 but made by printing means or in the manner of FIG. 1 herein may perform as well as those of the test dates just mentioned in this paragraph. An obvious additional cell is as evolved from "design three" using a single continuous anode means emitter means common to said multiple anode means.

Application of the present invention appears as stated for "597," i.e., common batteries, individual residence power plants, hybrid fuel and electric vehicles, cooling, electronic amplification and power transmission, and additionally as an electrical resistor when turned to oppose a current flow and also as a central power station. Multiple components as anode means, electrical resistor means and cathode means allow size control of components, as well as control of component mass. The object of the present invention is to provide an economical source of electric power and a versatile electrical component. Further possible application is seen as a rectifier and as an electronic gate since a voltage applied in opposition to a cell appears, if greater than cell voltage, to backflow through the cell, otherwise no backflow is obtained. The gate may be a problem.

DETAIL DESCRIPTION OF THE DRAWINGS

The four preceding designs are represented by drawn examples herein for clarification of design and function of the present invention.

Figure 1:
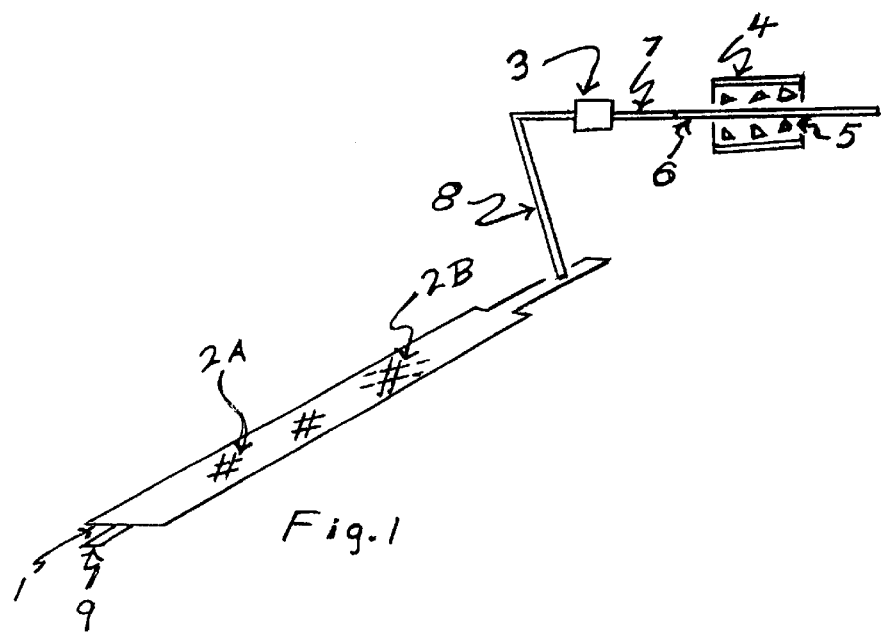
FIG. 1 is a schematic of a thermoelectric cell of "first design" type.

FIG. 1 is a schematic view of a thermoelectric cell of "first design" type. Item 1 is an anode means of galvanized sheet. Item 1 conforms to a length to width ratio of L/W=four times the square root of 10. The two of items 2A and 2B are multiple anode electron emitter means comprised of non-iodized salt dusted on plastic tape with adhesive on one side, the adhesive side with said salt contacting said anode means item 1, 2A on one side of item 1 and 2B on the other side. Item 3 is a within-cell electrical resistor means, an electrical resistor. Items 4 through 6 are a single cathode means of CPVC pipe, item 4, enclosing item 5, a cathode electron emitter means, non-iodized salt, and enclosing item 6, cathode portion of cathode means, galvanized sheet. Item 7 is an electrical conductor means of galvanized wire connecting single cathode means items 4–6 to a single electrical resistor means item 3. Item 8 is an electrical conductor means of galvanized wire connecting single electrical resistor means item 3 to single anode means item 1. Item 9 is an electrical conductor means of galvanized wire from anode means item 1.

A desirable area of the contact of the cathode portion of cathode means with cathode electron emitter means is one percent or less of the total area of contact of the anode means with the anode electron emitter means.

Figure 2:
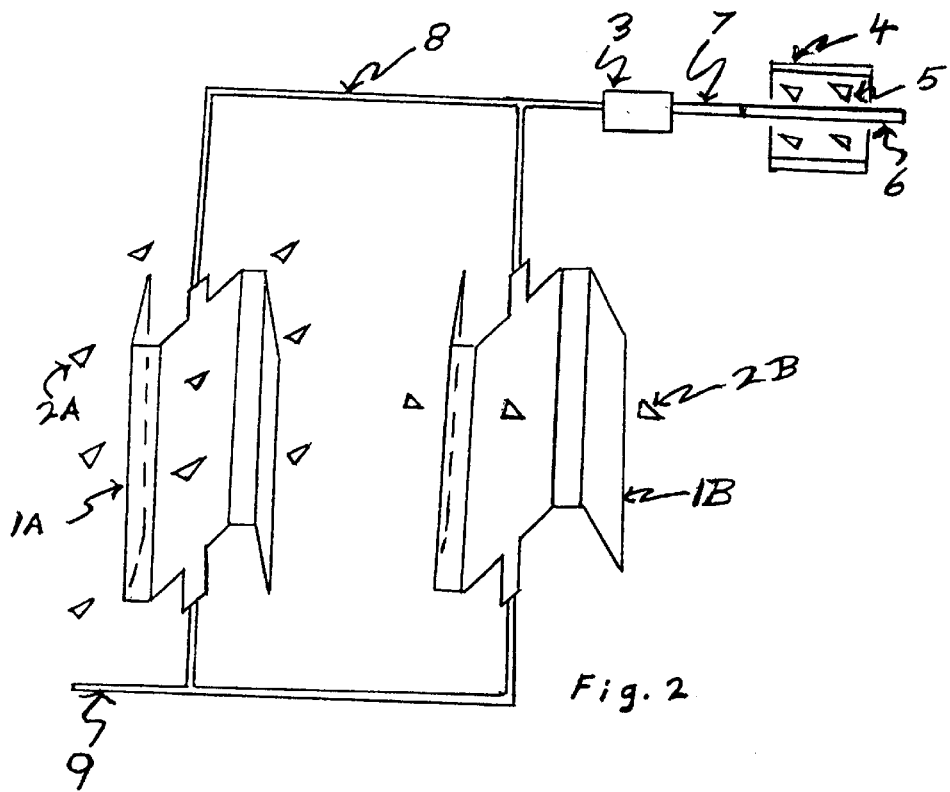
FIG. 2 is a schematic of a thermoelectric cell of "second design" type.

FIG. 2 is a schematic showing one thermoelectric cell of "second design " type. Items 1A and 1B are multiple anode means of galvanized sheet. Items 2A and 2B are anode means electron emitter means of non-iodized salt with desicant. Item 3 is a single electrical resistor means, an electrical resistor. Items 4 through 6 are a single cathode means of CPVC pipe, item 4, enclosing item 5, cathode electron emitter means of non-iodized salt with desicant and enclosing item 6, cathode portion of cathode means, galvanized sheet. Item 7 is an electrical conductor means of galvanized wire connecting single cathode means items 4–6 to single electrical resistor means item 3. Item 8 is an electrical conductor means of galvanized wire connecting single electrical resistor means item 3 to multiple anode means items 1A and 1B. Item 9 is an electrical conductor means of galvanized wire from multiple anodes means items 1A and 1B.

Each of items 1A and 1B conforms to a length to width ratio of L/W=$\sqrt{10}$ for the area contacted by the anode means electron emitter means.

A desirable area of contact of cathode portion of cathode means with cathode electron emitter means is one percent or less of the total area of contact of all anode means with all anode means electron emitter means.

Figure 3:
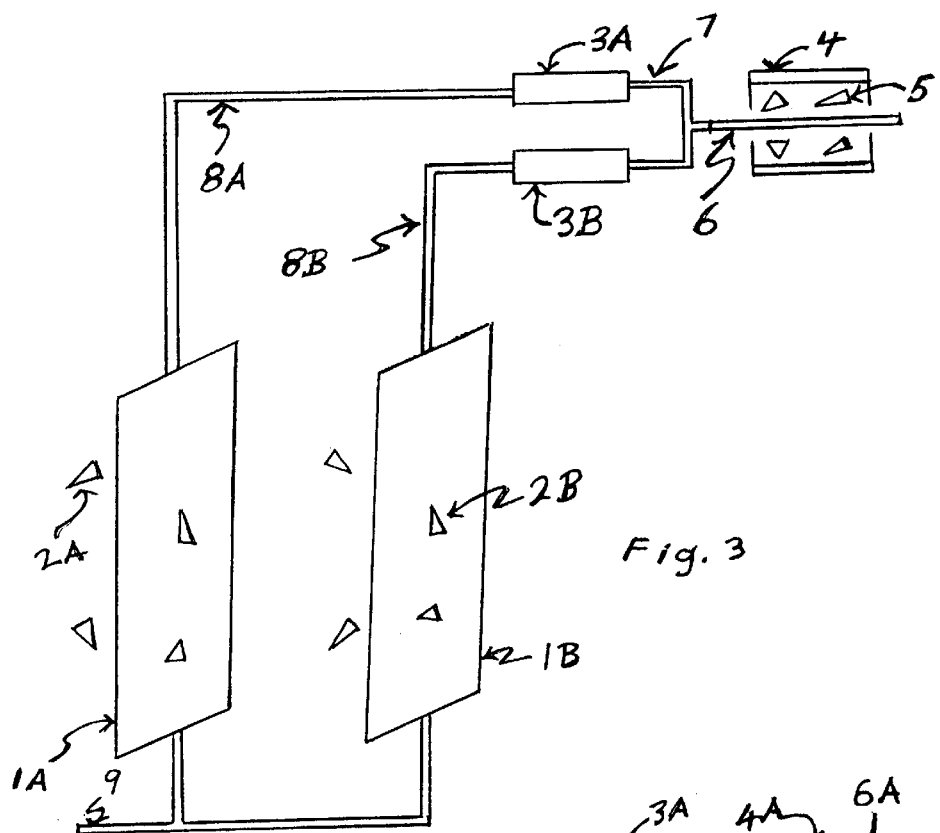
FIG. 3 is a schematic of a thermoelectric cell of "third design" type.

FIG. 3 is a schematic showing one thermoelectric cell of "third design" type. Items 1A and 1B are multiple anode means of galvanized sheet. Items 2A and 2B are anode means electron emitter means of non-iodized salt with desicant. Items 3A and 3B are electrical resistor means, electrical resistors. Items 4 through 6 constitute a single cathode means of CPVC pipe item 4 enclosing item 5, cathode electron emitter means of non-iodized salt with desicant, and enclosing item 6, cathode portion of cathode means, galvanized sheet. Item 7 is an electrical conductor means of galvanized wire connecting single cathode means items 4–6 to two electrical resistor means items 3A and 3B. Items 8A and 8B are electrical conductor means of galvanized wire, each connecting a single electrical resistor to a single anode means. Item 9 is an electrical conductor means of galvanized wire from multiple anodes means items 1A and 1B.

Each of items 1A and 1B conforms to a length to width ratio of L/W=4×$\sqrt{10}$ for area contacted by anode means electron emitter means.

A desirable area of contact of cathode portion of cathode means with cathode electron emitter means is one percent or less of the total area of contact of all anode means with all anode electron emitter means.

Figure 4:
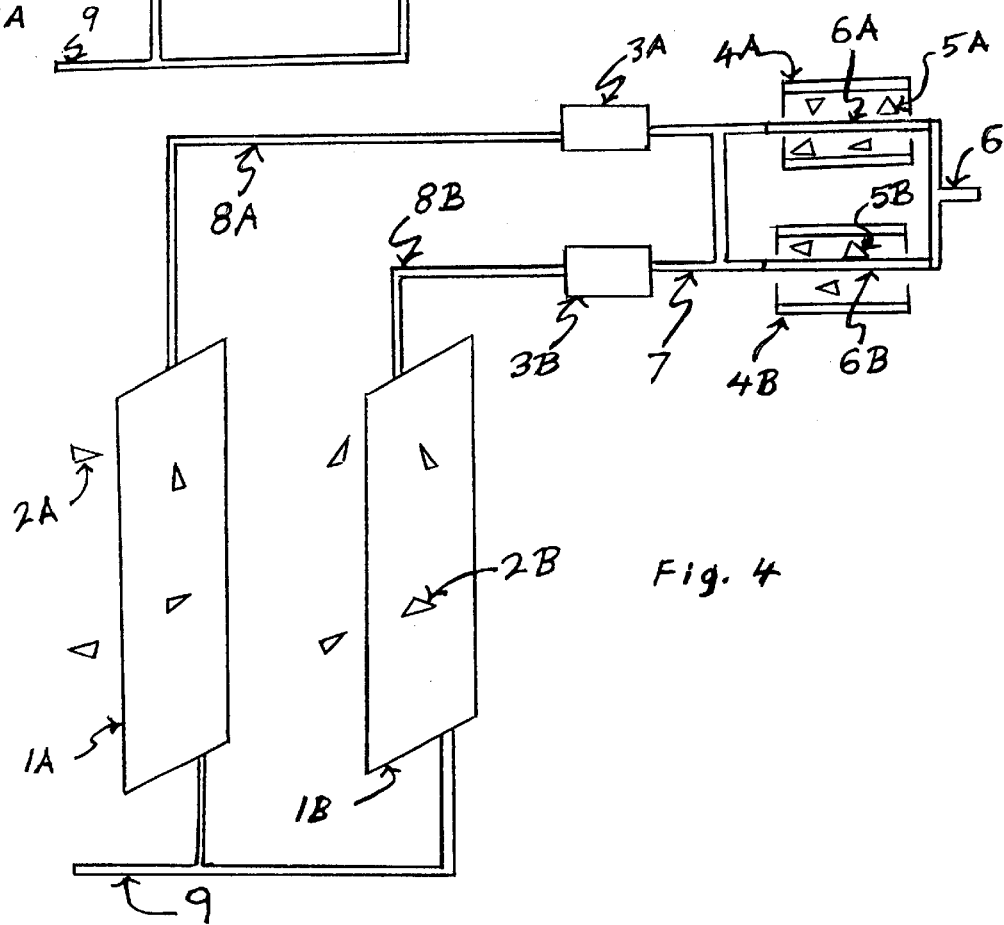
FIG. 4 is a schematic of a thermoelectric cell of "fourth design" type.

FIG. 4 is a schematic showing one thermoelectric cell of "fourth design" type as evolved from "third design" FIG. 3. Items 1A and 1B are multiple anode means of galvanized sheet. Items 2A and 2B are anode means electron emitter means of non-iodized salt with desicant. Items 3A and 3B are electrical resistor means, electrical resistors. Items 4A, 4B, 5A, 5B and 6A and 6B constitute two cathode means, each cathode means comprised of one of two CPVC pipes, items 4A and 4B respectively, enclosing items 5A and 5B respectively, cathode electron emitter means of non-iodized salt with desicant and enclosing items 6A and 6B respectively, cathode portion of cathode means, galvanized sheet. Items 6A and 6B join electrically to item 6, cathode portion extension. Item 7 is an electrical conductor means of galvanized wire connecting two cathode means items 4A through 6A and 4B through 6B to two electrical resistor means items 3A and 3B. Items 8A and 8B are electrical conductor means of galvanized wire, each connecting a single electrical resistor to a single anode means. Item 9 is an electrical conductor means of galvanized wire from multiple anode means items 1A and 1B. Each of items 1A and 1B conforms to a length to width ratio of $L/W=4\times\sqrt{10}$ for the area contacted by anode means electron emitter means.

A desirable area of contact of cathode portion of cathode means with cathode electron emitter means is one percent or less of total area of contact of all anode means with all anode electron emitter means.

DESCRIPTION OF THE PREFERRED EMBODIMENTS

The embodiment of FIG. 1, after connection by electrical circuitry of an extension on the right of cathode portion item 6 with item 9, electrical conductor means from anode means, develops a difference in electrical potential between item 9 and item 6 because anode means, item 1, being larger intercepts more electrons from two anode means electron emitter means items 2A and 2B than the smaller cathode portion item 6 does from cathode electron emitter means item 5 and item 1 develops a greater electrical potential than does item 6. Both anode means electron emitter means and cathode electron emitter means emit electrons when absorbing heat from their surroundings. As a result of development of a difference in electrical potential, an electric current flows from item 9 to item 6.

Description of embodiments of FIG. 2, FIG. 3 and FIG. 4 is the same as that for FIG. 1, allowing for multiple components.

I claim:

1. A thermoelectric cell comprised of a single anode means in electrical contact with multiple anode electron emitter means, displaying thermally induced electron emission, and of
    single within-cell electrical resistor means connected by electrical conductor means to said single anode means, and of
    single cathode means connected by electrical conductor means to said single resistor means wherein
    area of contact between a cathode portion of said cathode means and a cathode electron emitter means, displaying thermally induced electron emission, is smaller than
    area of contact between said single anode means and said multiple anode electron emitter means.

2. A thermoelectric cell comprised of multiple anode means, connected to one another in electrical parallel, each said anode means in electrical contact with a separate anode electron emitter means, said anode emitter means displaying thermally induced electron emission, and of
    single within-cell electrical resistor means connected by electrical conductor means to said multiple anode means, and of
    single cathode means connected by electrical conductor means to said single resistor means wherein
    area of contact between a cathode portion of said single cathode means and a cathode electron emitter means, displaying thermally induced electron emission, is less than area of contact between said multiple anode means and respective said anode electron emitter means.

3. A thermoelectric cell according to claim 2, wherein
    said cell further comprises additional within-cell electrical resistor means yielding multiple resistor means as appropriate, appropriate being determined by wattage service rating of said resistors and total wattage of anode means to which each said resistor connects to, and wherein
    said single cathode means connects by electrical conductor to said multiple resistor means.

4. A thermoelectric cell according to claim 1 or 2 or 3, wherein
    said cell further comprises additional cathode means to yield multiple cathode means, connected to one another in electrical parallel, connected by electrical conductor to each said within-cell resistor in said cell wherein
    total area of contact, in said multiple cathode means, of said cathode portions of said multiple cathode means with respective cathode electron emitter means is smaller than total area of contact of all anode means in said cell with all anode electron emitter means in said cell.

5. A thermoelectric cell according to claims 4, and, wherein
    said separate anode electron emitter means form a single continuous anode electron emitter means common to all said multiple anode means.

6. A thermoelectric cell according to claims 3, and, wherein
    said separate anode electron emitter means form a single continuous anode electron emitter means common to all said multiple anode means.

* * * * *